United States Patent
Mahoney et al.

(10) Patent No.: US 8,890,634 B2
(45) Date of Patent: Nov. 18, 2014

(54) MULTIPLEXED CONFIGURABLE SIGMA DELTA MODULATORS FOR NOISE SHAPING IN A 25-PERCENT DUTY CYCLE DIGITAL TRANSMITTER

(71) Applicant: MStar Semiconductor, Inc., Hsinchu Hsien (TW)

(72) Inventors: Dennis Mahoney, Greensboro, NC (US); Bernard Ginetti, Antibes (FR); Zhongxuan Zhang, Fremont, CA (US); Khurram Muhammad, Garland, TX (US); Chih-Ming Hung, Mckinney, TX (US); Ming-Yu Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 59 days.

(21) Appl. No.: 13/661,412

(22) Filed: Oct. 26, 2012

(65) Prior Publication Data

US 2014/0118081 A1    May 1, 2014

(51) Int. Cl.
*H04L 27/36*     (2006.01)
*H03C 5/00*      (2006.01)

(52) U.S. Cl.
USPC ........... 332/103; 341/143; 375/261; 375/298; 375/308; 375/329

(58) Field of Classification Search
USPC ........... 332/103–105; 341/143; 375/261, 279, 375/295, 296, 298, 308, 329
See application file for complete search history.

(56) References Cited

U.S. PATENT DOCUMENTS

| | | | | |
|---|---|---|---|---|
| 6,587,010 | B2 * | 7/2003 | Wagh et al. | 332/105 |
| 6,768,391 | B1 * | 7/2004 | Dent et al. | 332/185 |
| 6,990,155 | B2 * | 1/2006 | Adachi et al. | 375/298 |
| 7,158,578 | B2 * | 1/2007 | Khlat | 375/261 |
| 7,190,288 | B2 * | 3/2007 | Robinson et al. | 341/106 |
| 7,605,733 | B2 * | 10/2009 | Breems et al. | 341/143 |
| 7,715,493 | B2 * | 5/2010 | Ravi et al. | 375/296 |
| 7,738,597 | B2 * | 6/2010 | Smaini et al. | 375/316 |
| 2004/0192229 | A1 | 9/2004 | Morris et al. | |
| 2005/0237121 | A1 * | 10/2005 | Hirano et al. | 331/16 |
| 2006/0291589 | A1 | 12/2006 | Eliezer et al. | |
| 2010/0124290 | A1 * | 5/2010 | Kablotsky | 375/259 |
| 2010/0183093 | A1 * | 7/2010 | Ghannouchi et al. | 375/302 |
| 2011/0069784 | A1 * | 3/2011 | Petilli | 375/296 |

OTHER PUBLICATIONS

U.S. Appl. No. 13/484,485, filed May 31, 2012, 28 pages.

(Continued)

*Primary Examiner* — Levi Gannon
(74) *Attorney, Agent, or Firm* — Edell, Shapiro & Finnan, LLC

(57) ABSTRACT

A modulator generates a baseband digital signal from an information-bearing digital signal. The baseband signal has time-varying phase and amplitude defined by a sequence of complex data words, each having an in-phase (I) component and a quadrature (Q) component. A noise-shaping modulator generates a noise-shaped digital signal from the baseband digital signal such that quantization noise in the noise-shaping modulator is attenuated by a spectral null of its noise transfer function. The spectral null is selected by a noise-shaping parameter corresponding to a selected one of a plurality of output frequencies. A signal converter generates an analog signal conveying the information of the information-bearing digital signal on an analog carrier signal having the selected output frequency.

12 Claims, 8 Drawing Sheets

(56) References Cited

OTHER PUBLICATIONS

Ionascu et al., "Design and Implementation of Video DAC in 0.13µm CMOS Technology", 2003 IEEE, pp. 381-384.
Myderrizi et al., "A High-Speed Swing Reduced Driver Suitable for Current-Steering Digital-to-Analog Converters", 2009, IEEE, pp. 635-638.
Choi et al., "Design of Oversampling Current Steering DAC With 640 Mhz Equivalent Clock Frequency", 2002 IEEE, 4 pages.

* cited by examiner

MULTIPLEXED CONFIGURABLE SIGMA DELTA MODULATORS FOR NOISE SHAPING IN A 25-PERCENT DUTY CYCLE DIGITAL TRANSMITTER

TECHNICAL FIELD

The present disclosure relates to digital modulation of signals.

BACKGROUND

Frequency Division Duplex (FDD) communication standards, such as Wideband Code Division Multiple Access (WCDMA), provide that a transmitter operates in one frequency band and the receiver operates in another. The spectral offset between the Tx and Rx frequencies (known as a duplex frequency) for FDD systems is the same for any frequency in a band, though different bands will have different duplex frequencies. Spurious frequency components from the transmit (Tx) signal can overwhelm the receive (Rx) signal, particularly in highly sensitive receivers. Some systems, such as low-band Enhanced Data rates for GSM (Global System for Mobile Communications) Evolution (EDGE) systems, isolate the receiver while a transmitter is emitting. While such isolation protects the receiver from the transmitter in the same mobile device, the noise generated during transmission of one mobile device can impact the receiver of other mobile devices.

FIG. 1 illustrates frequency spectra of an example system, such as one of those described above. The span and location of receive band 120 remains constant for all Tx frequencies 110a-110n, representatively referred to herein as Tx frequency or frequencies 110, which can change upon command in certain devices. The respective offsets 115a-115n from the Tx carrier 110 to the Rx band 120, representatively referred to herein as offset(s) 115, are thus variable and, as such, present challenges in reducing noise in receive band 120 for all Tx frequencies 110. Reducing the noise by noise shaping, for example, such as by sigma-delta modulation, would require a very high sampling rate to span a noise-shaped frequency region, i.e., 20 MHz offset 115n to 70 MHz offset 115a, sufficient to cover the full range of Tx frequencies 110. Such high sampling rate places an often unacceptable burden on system resources.

SUMMARY

A modulator generates a baseband digital signal from an information-bearing digital signal. The baseband signal has time-varying phase and amplitude defined by a sequence of complex data words, each having an in-phase (I) component and a quadrature (Q) component. A noise-shaping modulator generates a noise-shaped digital signal from the baseband digital signal such that quantization noise in the noise-shaping modulator is attenuated by a spectral null of its noise transfer function. The spectral null is selected by a noise-shaping parameter corresponding to a selected one of a plurality of output frequencies. A signal converter generates an analog signal conveying the information of the information-bearing digital signal on an analog carrier signal having the selected output frequency.

DESCRIPTION OF EXAMPLE EMBODIMENTS

Figure 1:
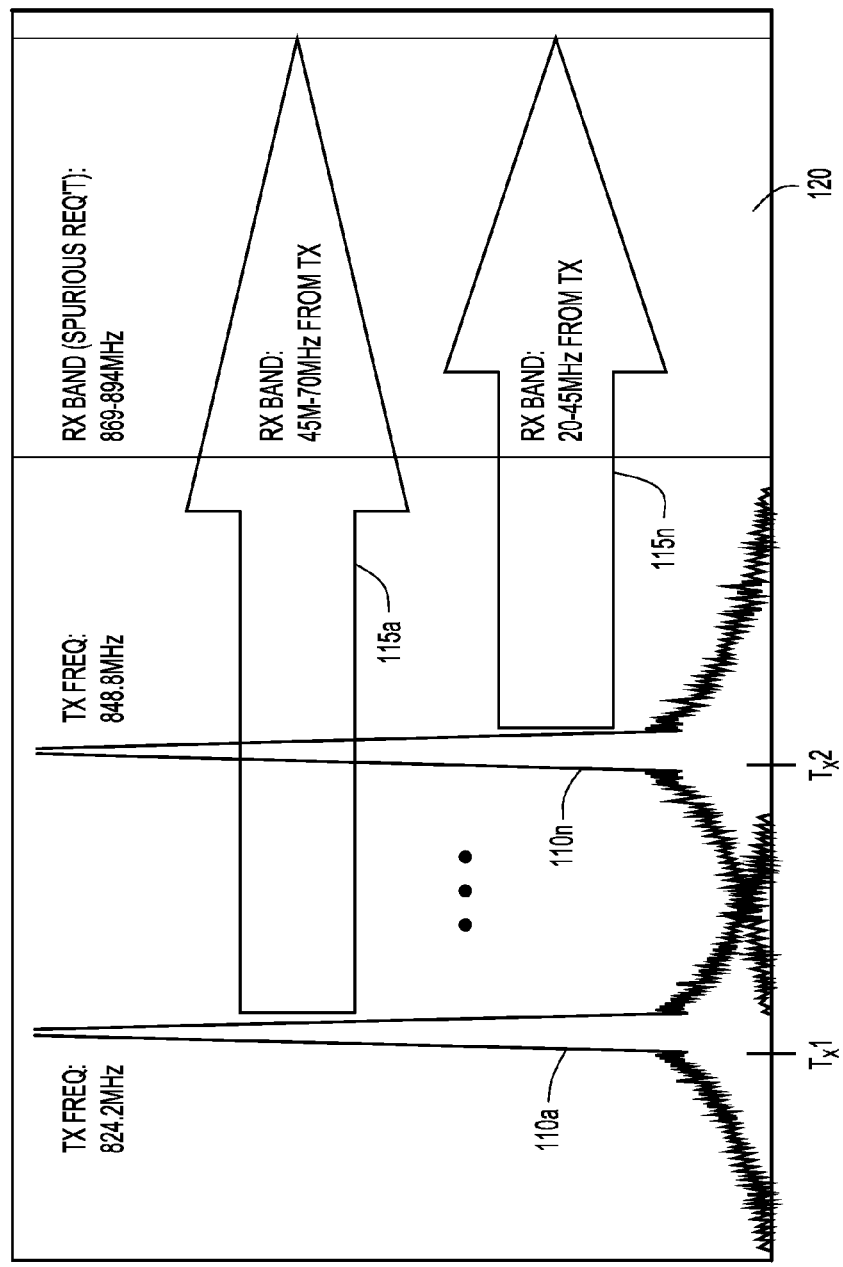
FIG. 1 is an illustration of transmit and receive frequency spectra of certain communication systems.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, mathematical expressions are contained herein and those principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

Figure 2A:
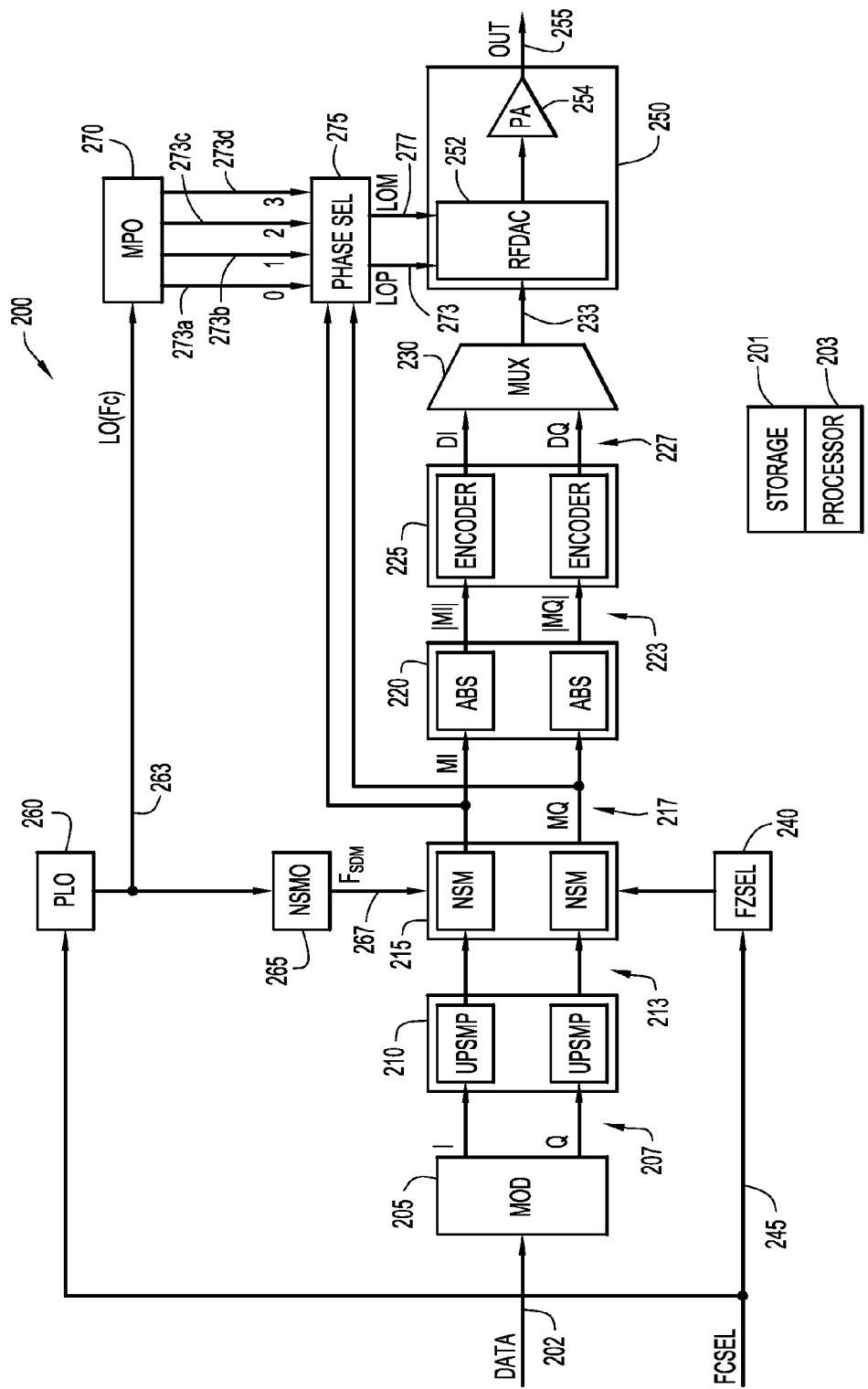
FIG. 2A is a schematic block diagram of a signal modulator by which the present general inventive concept can be embodied.

FIG. 2A is a schematic block diagram of a signal modulator 200 by which an information-bearing digital signal 202 may be modulated onto a carrier signal having frequency $F_C$ that is selected by way of carrier frequency selection signal 245. It is to be understood that signal modulator 200 is but one example configuration; other system configurations and signals may embody the present invention without departing from the spirit and intended scope thereof. Signal modulator 200 may include, for example, a processor 203 and a storage device 201 to implement functionality described herein. That is, certain signal processing operations described below may be carried out through processor 203 executing processing instructions in storage device 201. However, it is to be understood that the present invention can be carried out in a wide variety of fixed and programmable logic, as well as other digital and analog circuitry.

Digital signal 202 may be modulated into a baseband signal 207 by modulator 205. Baseband signal 207 may comprise data symbols having real and imaginary components, referred to herein as in-phase (I) and quadrature (Q) components, that together represent time varying phase and amplitude in baseband signal 207. That is, data in baseband signal 207 can be conceptualized as a complex number z=i+jq, for I=i and Q=q, having, at any instant in time, amplitude r= $\sqrt{i^2+q^2}$ and phase:

$$\phi = \arg(i, q) = \begin{cases} \arctan(q/i), & i > 0 \\ \pi/2 - \arctan(i/q), & q > 0 \\ -\pi/2 - \arctan(i/q), & q < 0 \\ \pi + \arctan(q/i), & i < 0, y \geq 0, \\ -\pi + \arctan(q/i), & i < 0, q < 0 \\ \text{Undefined}, & i = 0, q = 0, \end{cases}$$

where r and $\phi$ are taken with respect to the origin and positive real axis, respectively, in a complex number plane having real and imaginary axes. It is to be noted from the above that r and $\phi$ can be determined from |i|, |q|, and the algebraic signs of both i and q.

As illustrated in FIG. 2A, signal processing in signal modulator 200 that is subsequent to baseband modulation and prior to multiplexing data into a single stream, as will be described below, occurs in separate but similarly constructed processing channels, referred to herein as I and Q channels, respectively. Thus, while certain processing components in FIG. 2 may be described herein as if being realized by a single component, the ordinarily skilled artisan will recognize and appreciate that such description carries the implication of multiple components performing like operations in separate I and Q processing channels.

As illustrated in FIG. 2, carrier frequency selection signal 245 is provided to a programmable local oscillator (PLO) 260, which may be implemented by, for example, a fractional-N synthesizer based on a system clock (not illustrated). PLO 260 may generate a local oscillator (LO) signal 263 corresponding to a selected carrier frequency $F_C$. Additionally, carrier frequency selection signal 245 may be provided to a frequency zero selection processor 240 that generates one or more noise shaping parameters in accordance with the selected carrier frequency $F_C$.

Baseband signal 207 may be upsampled by upsampler 210 to produce an upsampled baseband signal 213, which may be provided to noise-shaping modulator (NSM) 215. NSM 215, in turn, modifies the frequency content of upsampled signal 213 so as to reduce the resolution of the signal and thus the spectral power of the noise in a selected frequency band is attenuated by the quantization in NSM 215. Such noise shaping may be achieved by sigma-delta modulation, as described below.

In certain embodiments, the processing rate of NSM 215 is established by an NSM oscillator signal 267 generated by an NSM oscillator 265. The frequency $F_{SDM}$ of NSM oscillator signal 267 may be selectable according to the selected carrier frequency $F_C$. For example, in certain embodiments, NSM oscillator signal 267 has the same frequency of LO signal 263 if the frequency of LO signal 263 is below a certain rate, e.g., one (1) GHz, and may be another frequency, e.g., LO/2, if the frequency of LO signal 263 is above the certain rate, e.g., between 1 GHz and 2.1 GHz. However, it is to be understood that the present invention is not limited to particular NSM timing techniques, as will be recognized and appreciated by the ordinarily skilled artisan upon review of this disclosure.

Noise-shaped signal 217 may be provided to an absolute value processor 220 by which each component MI, MQ of signal 217 is stripped of its algebraic sign. The algebraic signs of MI, MQ are provided to phase select processor 275 where they may be stored for a number of processing cycles sufficient to account for processing delays from the output of NSM 215 to digital power amplifier (DPA) 250. Signal 223 at the output of absolute value processor may be provided to encoder 225 by which signal 223 may be encoded for efficient conversion by the applicable digital-to-analog conversion architecture. In certain embodiments, encoder 225 translates the symbols of signal 223 to unary coded symbols (also known as thermometer coding) by which bit states in the coded symbols of signal 227 are used to select states of current cells in a digital-analog converter (DAC). For example, a unary coded zero (0) selects no cell, i.e., all current cells are in a non-conducting state, and unary-coded maximum input, e.g., N ones (1) followed by a zero (0) in the least significant bit position for a total of N+1 bits, corresponds to selection of all cells, i.e., all current cells are in a conducting state. As opposed to binary coding, a unary coded DAC implements equivalently sized cells and eliminates undesirable switching artifacts generated in binary coded DACs caused by binary-weighted cell selection once the provided binary code rolls over from, e.g., 3 to 4, 7 to 8, 15 to 16, etc. It is to be understood, however, that the present invention is not limited to any particular DAC encoding scheme.

Encoded signal 227 may be multiplexed into a multiplexed data stream 233 by multiplexer 230. Data stream 233 may be a sequence {DI, DQ, DI, DQ, . . . } where DI and DQ are the outputs of encoder 225 by respective I and Q processing channels thereof. Multiplexed data stream 233 may be provided to DPA 250, which produces an amplified analog signal 255 carrying the information of information-bearing data 202 at the carrier frequency $F_C$ selected by carrier frequency signal 245. To that end, DPA 250 may include a radio frequency digital-to-analog converter (RFDAC) 252 to convert data stream 233 into an analog signal and a suitable power amplifier 254 to amplify the analog signal. It is to be understood that, although DPA 250 is illustrated as containing discrete components implementing RFDAC and power amplifier functionality, such is solely for descriptive purposes. The present invention is not limited to any particular architecture of back-end functionality, nor to the functionality itself, which will vary by application.

Figure 2B:
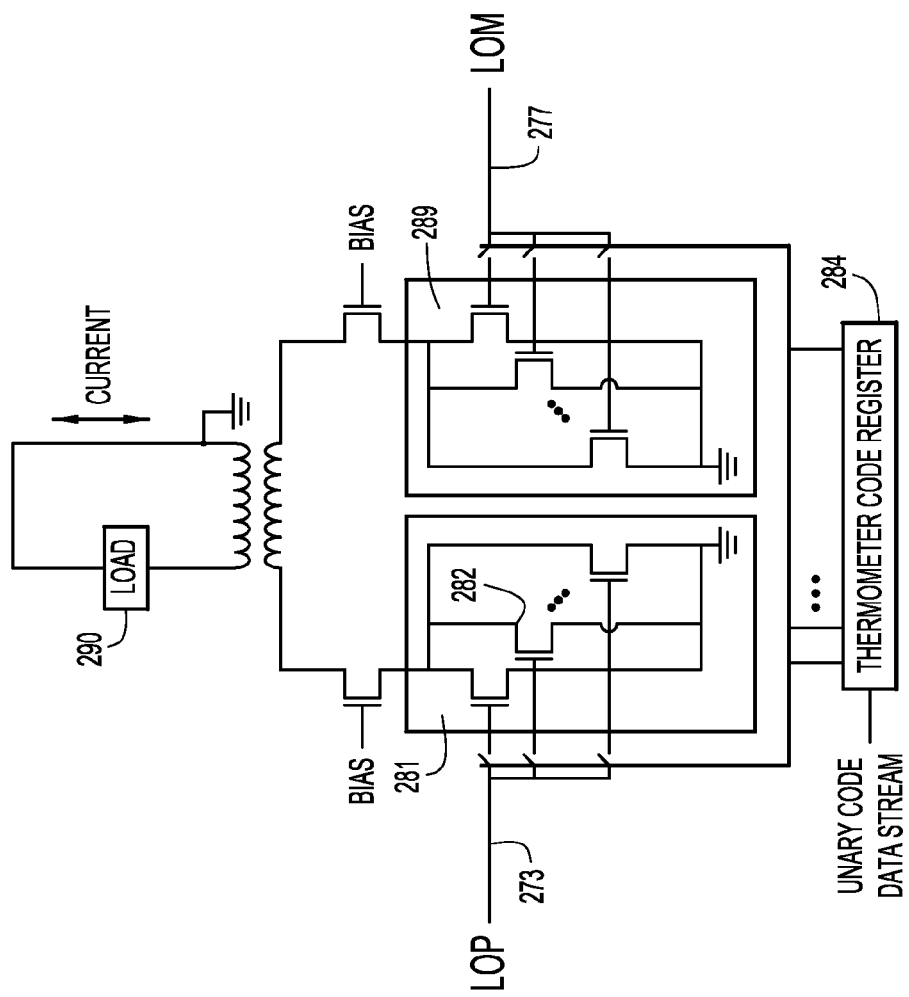
FIG. 2B is a schematic block diagram of a digital-to-analog conversion circuit that can be used in conjunction with the present general inventive concept.

FIG. 2B is a schematic diagram illustrating an example approach in which RFDAC 252 may be realized. RFDAC 252 may be constructed from one or more structures 280, each containing a number of transistor cells, representatively illustrated at transistor 282 and representatively referred to herein as cell(s) 282. Cells 282 are connected electrically in parallel and, when compelled into a conducting state, an output current proportional to the number of cells in the conducting state flows through a connected load 290. Cells 282 are compelled into a conducting state by a combination of corresponding bit states of unary coded data in register 284 and by a state of control signals LOP 273 and LOM 277, which may be a phase signal from multiphase oscillator (MPO) 270 and phase select processor 275, as will be described in more detail below.

As with any DAC, RFDAC 252 can only change the amount of current that flows through the output, i.e., from zero to maximum deliverable current, and cannot produce a negative current amount. As illustrated in FIG. 2B, RFDAC 252 includes a pair of DAC banks 281, 289 that alternate the direction of current through load 290. Positive signal outputs can be provided by turning on a desired number of cells 282 in the plus-RFDAC bank 281 (turned on with LOP signal 273) and negative outputs are provided by turning on a desired number of cells 282 in the minus-DAC bank 289 (turned on by LOM signal 277). Zero is selected by turning off all elements. Fractional values may be generated through time dithering of one cell 282.

Figure 3:
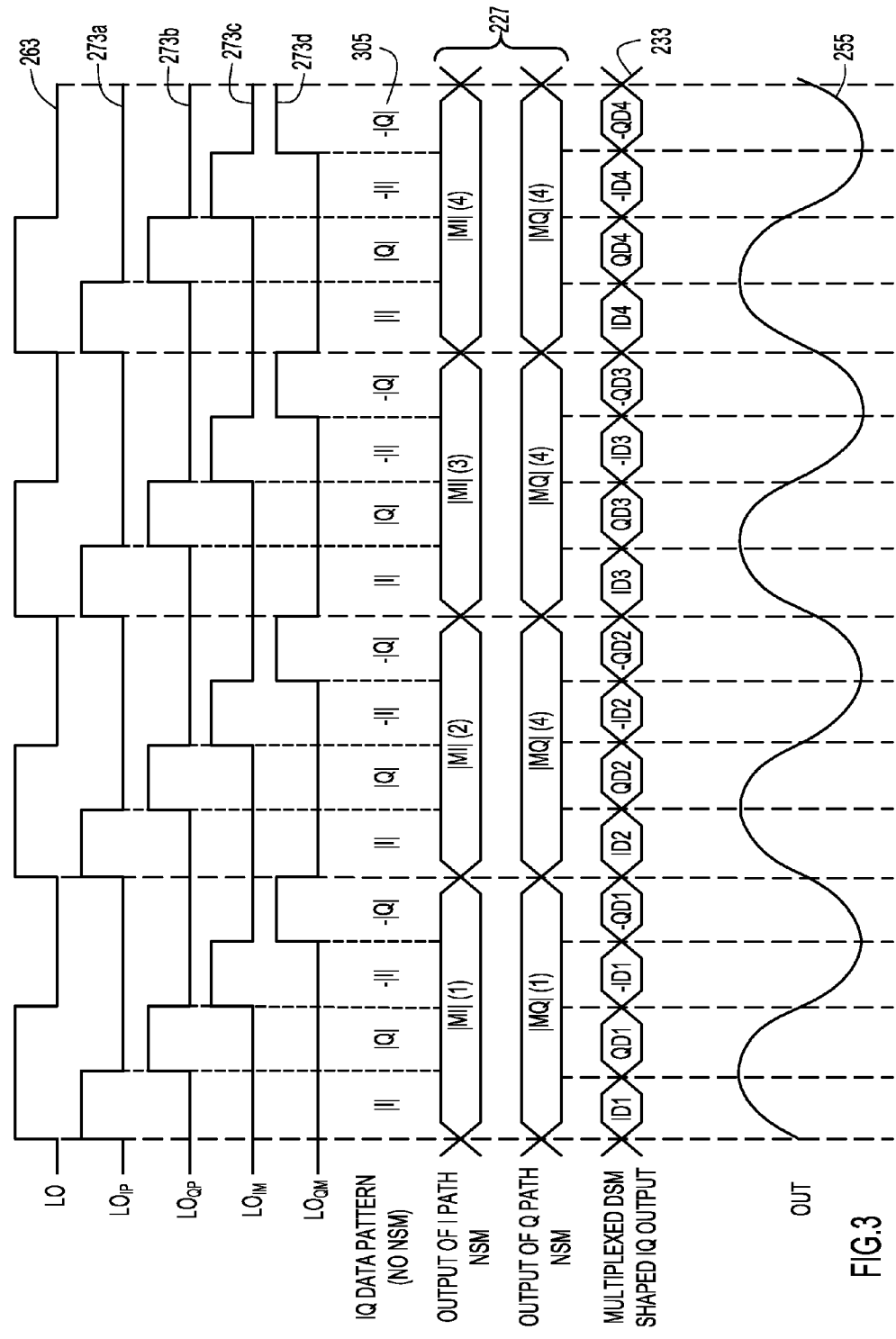
FIG. 3 is a timing diagram illustrating signal processing by which the present general inventive concept can be embodied.

Returning to FIG. 2A, signal modulator 200 includes MPO 270 to generate phase signals 273a-273d, representatively referred to herein as phase signal(s) 273. Phase signals 273 may be applied to DPA 250 through phase select circuit 275, which, in turn, provides cell bank selection signals LOP 273 and LOM 277 to DPA 250. Cell bank selection signals LOP 273 and LOM 277 may be provided to cell banks 281, 289, respectively, in RFDAC 252 in an order defined by the upconversion of the original baseband signal 213. This is clarified through the timing diagram illustrated in FIG. 3, where LO signal 263 is provided from PLO 260 in accordance with carrier selection signal 282. LO signal 263 may be provided to MPO 270 to generate phase signals 273. It is to be understood that while phase signals 273 are illustrated in FIG. 3 as having 25% duty cycle non-overlapping pulses, the present invention is not so limited. The present invention may also be implemented for a lower duty-cycle non-overlapping LO based system with 90 degree phase separation and other non-90 degree LO based solutions. The ordinarily skilled artisan will recognize RFDAC timing schemes other than those described herein that can be used in conjunction with the present invention.

The data is to be converted in a prescribed order to produce a correct analog signal OUT, i.e., output signal 255. In the exemplary system of FIG. 2, output signal 255 is produced from the sequence {I, Q, −I, −Q, I, Q, −I, −Q . . . } or, equivalently, {|I|, |Q|, −|I|, −|Q|, |I|, |Q|, −|I|, −|Q|, . . . }, which is illustrated as data pattern 305 in FIG. 3. The data provided to DPA 250 is derived from the absolute values of the noise-shaped data, i.e., {|MI|, |MQ|, |MI|, |MQ|, |MI|, |MQ|, |MI|, |MQ|, . . . } and the algebraic signs thereof are used only to determine the direction of current in load 290. As such, the algebraic signs are used to select the phase of the phase signal 273, e.g.:

TABLE 1

| Case | Phase Selected |
|---|---|
| MI > 0 and MQ > 0 | $LO_{IP}$ (Phase 0) to LOP |
| MI > 0 and MQ < 0 | $LO_{QM}$ (Phase 3) to LOM |
| MI < 0 and MQ > 0 | $LO_{QP}$ (Phase 1) to LOP |
| MI < 0 and MQ < 0 | $LO_{IM}$ (Phase 2) to LOM |

Signal 227 remains stable for an entire period of LO. That is, the number of cells 282 in RFDAC 252 that are in the conducting state remains unchanged throughout the interval over which LO is high and throughout the interval over which LO is low. DPA 250 accepts DI and DQ inputs in data stream 233, as sampled by phase signals 273, and up-converts the original modulated signal 207 by converting the values DI, DQ, −DI, −DQ at four (4) times the LO rate, i.e., these four outputs DI, DQ, −DI, −DQ are sampled by phase signals 273 inside one cycle of LO 263. The converted output signal 255 thus has the period of LO, which corresponds to the selected carrier frequency $F_C$.

Figure 4:
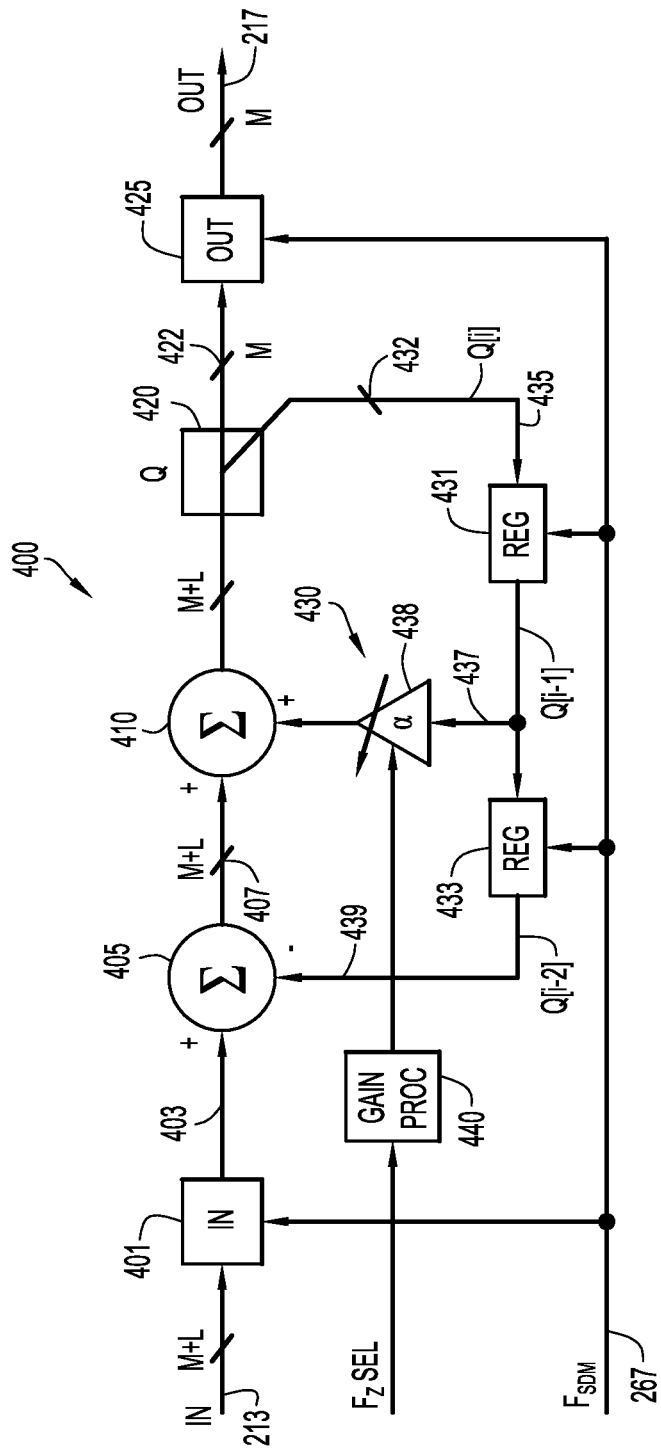
FIG. 4 is a schematic block diagram of a digital-to-digital sigma-delta modulator for implementing variable noise-shaping modulation.

FIG. 4 illustrates a sigma-delta modulator (SDM) 400 that may be used to realize each noise shaping modulator (NSM) 230 in FIG. 2. Each sample in upsampled signal 213 may be a digital word of width M+L bits representing a value of the modulated, information-bearing signal 207. The present invention is not limited to a specific word width or to the division of M and L within a word. For purposes of description and not limitation, M will refer to a number of most-significant bits (MSB) of the digital sample word and L will refer to the remaining least-significant bits (LSB) of the sample word. For example, a sample value may occupy twenty (20) bits, where M=12, the twelve most-significant bits and L=8, the eight least-significant bits. The M+L bits of the digital word may be conveyed in respective conductors of an M+L wide bus, representatively illustrated at bus 407.

Modulated signal 213 may be provided to input port 401, through which the samples are accepted into SDM 400 at sample frequency $F_{SDM}$. Noise-shaped samples exit SDM 400 through an output port 425 also at the sample frequency $F_{SDM}$. Quantizer 420 provides a quantized number of M bits to output port 425 and the quantization remainder of L bits is fed back along a feedback path 435. Quantizer 420 may be implemented by a suitable bus configuration where the M most-significant bits, referred to herein as an output word, are conveyed over an M-bit wide bus, representatively illustrated at bus 422, and the L least significant bits, referred to herein as a quantization error word, are conveyed over an L-bit wide bus, representatively illustrated at bus 432. It is to be understood that other quantizer configurations may be used in conjunction with the present invention without departing from the spirit and the intended scope thereof.

Feedback path 435 conveys quantization error words, denoted hereinafter as Q[i], through a feedback circuit 430 to respective adders 410, 405. After a unit sample storage interval in register 431, Q[i−1] is conveyed to circuit branch 437 and to register 433. After another unit sample storage interval in register 433, Q[i−2] is conveyed along circuit branch 439 to adder 405. Feedback circuit 430 includes a variable-gain multiplier 438 in circuit branch 437, the output of which, α·Q[i−1], is provided to adder 410. Feedback circuit 400 processes and distributes the words Q[i] and α·Q[i−1] along a processing trajectory by which noise shaping is realized. The ordinarily skilled artisan will recall that noise-shaping in an SDM pushes quantization noise into frequency bands outside and significantly removed from the baseband spectrum. In addition to such noise shaping, the gain α of variable-gain multiplier 438 may be computed by gain processor 440 such that a spectral null is located in the spectrum of modulated digital signal 232 at the desired frequency.

The ordinarily skilled artisan will recognize that the Noise Transfer Function (NTF) of SDM 400 is given by:

$$NTF = \frac{OUT(z)}{N(z)}\bigg|_{IN(z)=0} = 1 - \alpha z^{-1} + z^{-2}.$$

In certain embodiments, the NTF may be segmented, e.g.:

$$NTF(z) = \begin{cases} 1 + 2z^{-1} - [z^{-1} \gg (4 - nfz)] + z^{-2} & nfz = 0, 1, 2, 3 \\ 1 + 2z^{-1} - [z^{-1} \gg (nfz - 3)] + z^{-2} & nfz = 4, 5, 6 \\ 1 - z^{-1} + z^{-2} & nfz = 7 \end{cases}$$

or, $$NTF(z) = \begin{cases} 1 + (2 - 2^{-(4-nfz)})z^{-1} + z^{-2} & nfz = 0, 1, 2, 3 \\ 1 + (1 + 2^{-(nfz-3)})z^{-1} + z^{-2} & nfz = 4, 5, 6 \\ 1 - z^{-1} + z^{-2} & nfz = 7 \end{cases}$$

where the gain α controls the location of the zero for various carrier frequencies and is varied through a 3-bit parameter nfz. The zeros of the NTF are found through:

$$NFZ\left(e^{j2\pi \frac{f}{F_{SDM}}}\right) = 0$$

The location of the zeros are thus given by, $$f = f_z = F_{SDM} \frac{\text{acos}\left(\frac{nfz}{2}\right)}{2\pi}$$

Table 2 below illustrates possible settings of nfz for the NTF above as well as the corresponding zero location, occurring for frequency $f=f_z$

TABLE 2

| nfz setting | A | $f_z/F_{SDM}$ |
|---|---|---|
| 0 | 31/16 | 0.0399 |
| 1 | 15/8 | 0.0566 |
| 2 | 7/4 | 0.0804 |
| 3 | 3/2 | 0.115 |
| 4 | 3/2 | 0.115 |
| 5 | 5/4 | 0.1425 |
| 6 | 9/8 | 0.1549 |
| 7 | 1 | 0.1667 |

Table 3 below illustrates several communication systems in which a single communication device implementing the present invention can be operated.

TABLE 3

| System | Tx Band | Low Noise Rx Band | nfz |
|---|---|---|---|
| GSM850 | 824.2-848.8 MHz | 869-894 MHz | 0, 1, 2, 3 (or 4) |
| GSM900 | 880.2-914.8 MHz | 925-960 MHz | 0, 1, 2 |
| GSM1800 | 1710.2-1784.8 MHz | 1805-1880 MHz | 3, 4, 5 |
| GSM1900 | 1850.2-1908.8 MHz | 1930-1990 MHz | 2, 3, 4 |
| TDSCDMA B34 | 2010-2025 MHz | 1805-1880 MHz and 1900-1920 MHz | 7 |
| TDSCDMA B39 | 1880-1920 MHz | 1805-1850 MHz and 2010-2025 MHz | 2, 3 | where the acronym TDSCDMA refers to Time Division Synchronous Code Division Multiple Access.

The data in either or both of the Table 2 and Table 3 may be stored in memory, such as in storage unit 201, such that, for a given communication system to which a communication device is connected, the appropriate frequency zero is selected for noise shaping.

Figure 5:
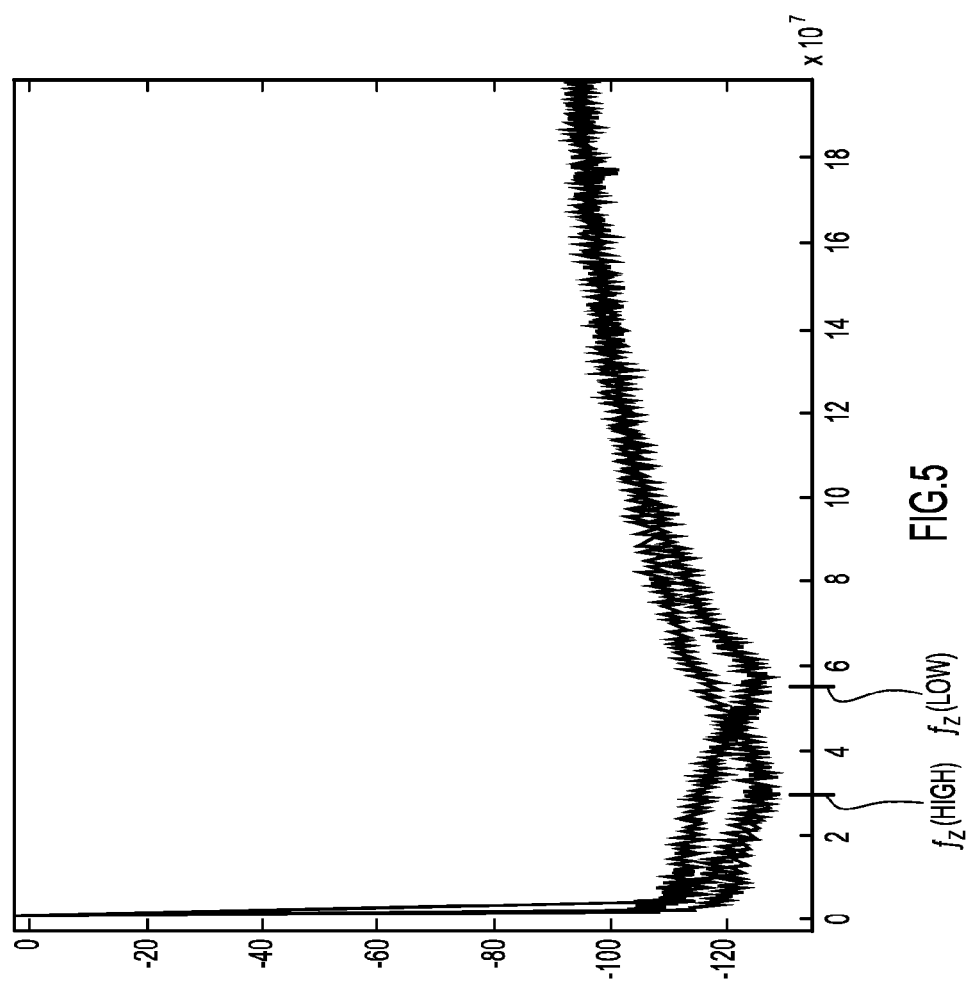
FIG. 5 is an illustration of transmit frequency spectra having spectral nulls established therein in accordance with embodiments of the present general inventive concept.

FIG. 5 is a graph illustrating transmitted frequency spectra for two different carrier frequencies. The carrier spectra are overlaid one onto the other to show the offset of the spectral zeros from the carrier frequency for each case. As illustrated in the figure, $f_z$(high) is a zero programmed in NSM 215 corresponding to a carrier frequency that is greater than that for which $f_z$(low) is programmed. Each of the spectral nulls $f_z$(high) and $f_z$(low) are selected to coincide with a particular band, such as receive band 120 illustrated in FIG. 1. However, it is to be understood that the present invention is not limited to systems having a single receive band for multiple transmit frequencies; many combinations of transmit receive bands can be accommodated by embodiments of the present invention.

Figure 6:
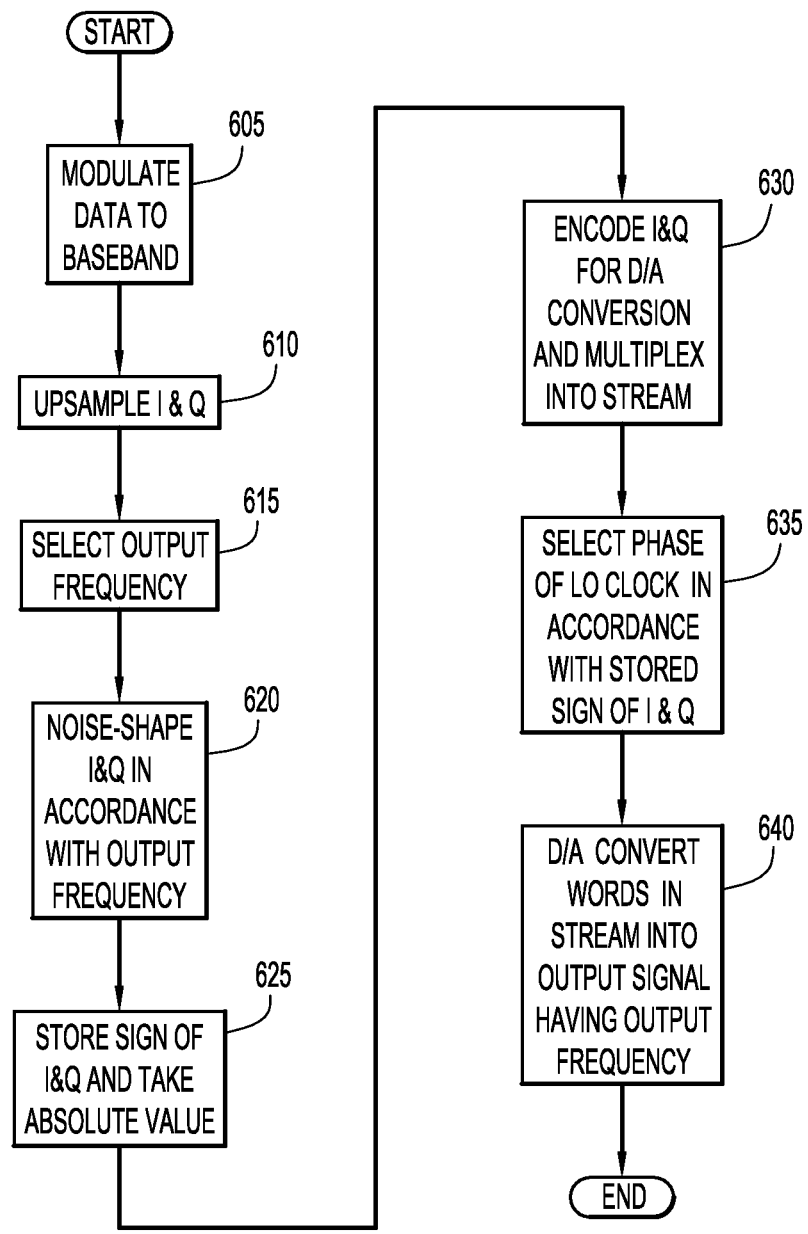
FIG. 6 is a flow diagram of a signal modulation process by which the present general inventive concept can be embodied.
Figure 7:
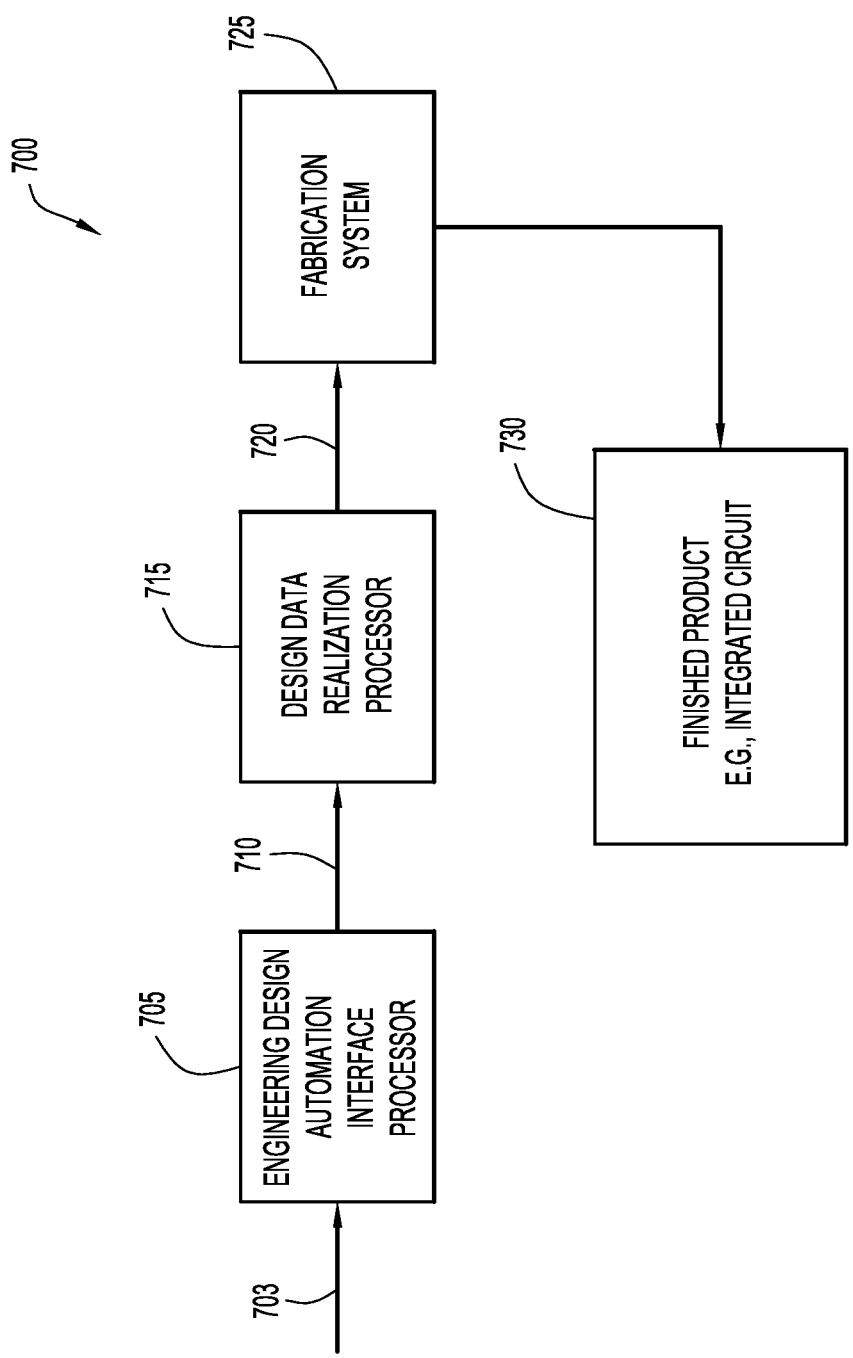
FIG. 7 is a block diagram of a circuit design and fabrication process by which a signal modulator circuit embodying the present general inventive concept may be fabricated.

In FIG. 6, a signal modulation process 600 is illustrated through which the present invention may be embodied. The operations of process 600 may be achieved through suitable hardware and/or software, such as by the mechanisms described above. In operation 605, data are modulated into a baseband signal having time-varying amplitude and phase. Such amplitude and phase information may be carried in I and Q symbols, which are upsampled in operation 610. In operation 615, the carrier frequency is selected and, in operation 620, the I and Q symbols are noise-shaped such that a generated frequency null is offset from the selected carrier frequency by an amount corresponding to the selected carrier frequency. In operation 625, the algebraic sign of I and Q are stored and stripped from the noise-shaped I and Q symbols in an absolute value process. In operation 630, the magnitude information of I and Q, as computed by way of the absolute value, are encoded for signal conversion and are multiplexed into a data stream. The stored algebraic signs of I and Q are used to select a phase signal in operation 635 and are converted into an analog output signal having the carrier frequency in operation 640.

Certain embodiments of the present invention provide for the functional components to manufactured, transported, marketed and/or sold as processor instructions encoded on non-transitory computer-readable media. For example, one such computer-readable medium (not illustrated) may be provided to a circuit fabrication process 700 carrying processor instructions 703 that, when executed by an Electronic Design Automation (EDA) interface processor 705, a graphical representation of an embodiment of the present invention is presented to a user, such as on a display device (not illustrated). Through EDA interface 705, a circuit designer may incorporate the present invention into a larger circuit design. Once a circuit design has been completed, another non-transitory computer-readable medium (not illustrated) carrying other processor instructions 710, such as a hardware description language, may be provided to a design data realization processor 715. The design data realization processor 715 may convert the instructions 710 provided thereto into another set of processor instructions 720, by which a tangible e.g., integrated circuit 730, may be realized when executed by a circuit fabrication system 725. Such realization data 720 may include data to construct component and interconnect mask patterns, component placement location data, packaging data, and any other data necessary in a fabrication process to produce the finished circuit product 730. Other realization data 720 may include milling machine instructions and wiring instruction data, where the specific form of the realization data 720 is dependent on the type of circuit 730 in which the present invention is embodied.

Processor instructions 703, 710 and 720 may be encoded on non-transitory computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions 703, 710 and 720, as well as processor instructions that implement process 600 in FIG. 6, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus comprising:
    a modulator to generate a baseband digital signal from an information-bearing digital signal, the baseband signal having a time-varying phase and an amplitude defined by a sequence of complex data words, each complex data word having an in-phase (I) data word and a quadrature (Q) data word;
    a noise-shaping modulator to generate a noise-shaped digital signal from the baseband digital signal such that quantization noise is attenuated by a spectral null of a noise transfer function characterizing the noise-shaping modulator, the spectral null being selected by a noise-shaping parameter corresponding to a selected one of a plurality of output frequencies; and
    a signal converter to generate an analog signal conveying the information of the information-bearing digital signal on an analog carrier signal having the selected output frequency,
    wherein the noise-shaping modulator comprises:
    a quantizer to generate a quantized digital word and a quantization error word for each I data word and for each Q data word of the baseband digital signal;
    a variable multiplier to multiply the quantization error word of the I data word and the Q data word by a value selected in accordance with the noise-shaping parameter such that quantization noise generated by the quantization of the quantizer is attenuated by the spectral null of the noise transfer function characterizing the noise-shaping modulator; and
    an adder to add the multiplied quantization error word of the I data word and the Q data word to a corresponding subsequent I data word and Q data word of the baseband digital signal,
    wherein the quantizer comprises:
    a multi-conductor bus of conductors by which a number of upper bits of the I data word and the Q data word of the modulated digital signal are directed in respective circuit paths out of the noise-shaping modulator as the noise-shaped digital signal, and a number of lower bits of the I data word and the Q data word of the modulated digital signal are directed to the variable multiplier of the noise-shaping modulator as the quantization error word of the I data word and the Q data word,
    wherein the noise-shaping modulator comprises an I sigma-delta modulator for the I data word and a Q sigma-delta modulator for the Q data word,
    the apparatus further comprising a frequency zero selection unit to generate the noise-shaping parameter in accordance with the selected output frequency.

2. The apparatus of claim 1, wherein the noise-shaping parameter generated by the frequency zero selection unit is provided to both the I sigma-delta modulator and the Q sigma-delta modulator.

3. The apparatus of claim 1 further comprising:
    an oscillator to generate a local oscillator signal at the selected output frequency; and
    a multiple phase oscillator communicatively coupled to the signal converter to provide to the signal converter a plurality of phase signals at the selected output frequency, the phase signals having synchronized with the local oscillator signal such that the periods of all of the phase signals are complete within a period of the local oscillator signal.

4. The apparatus of claim 3 further comprising:
    a phase selection circuit to apply a sequence of the phase signals to the signal converter in accordance with algebraic signs of a stream of I data words and Q data words.

5. A method comprising:
    receiving an information-bearing signal having time-varying phase and amplitude defined by a sequence of complex data words, each complex data word having an in-phase (I) data word and a quadrature (Q) data word;
    selecting a noise-shaping parameter for the sequence of data words in accordance with a selected one of a plurality of output frequencies;
    modulating the complex data words in accordance with the noise shaping parameter to shape the spectral content of the sequence of complex data words; and
    generating a current proportional to a stream of I data words and Q data words of the modulated data words to form an output signal at the selected output frequency,
    wherein modulating the complex data words comprises:
    quantizing the I data word and the Q data word where the quantizing produces a quantization error therein characterized by a noise transfer function;
    establishing a frequency null in the noise transfer function in accordance with the noise shaping parameter; and
    modulating the I data word and the Q data word in accordance with the noise transfer function having the frequency null established therein, and
    wherein establishing the frequency null comprises:
    establishing a coefficient variable that locates a numerical zero in the noise transfer function; and
    assigning a value to the coefficient variable in accordance with the selected output frequency.

6. The method of claim 5 further comprising:
    associating a plurality of values for the coefficient variable with respective output frequencies;
    storing the associated values and indexes in a storage device;
    selecting the output frequency from the plurality of output frequencies; and
    retrieving from the storage device the value for the coefficient variable associated with the selected output frequency.

7. The method of claim 5, wherein modulating the I data word and the Q data word in accordance with the noise transfer function comprises:
    modulating the I data word and the Q data word by sigma-delta modulation.

8. The method of claim 5 further comprising:
    generating a plurality of oscillator signals each shifted in phase with respect to the other oscillator signals;
    encoding the modulated I data word and the modulated Q data word into bit patterns for signal conversion;

multiplexing the bit patterns into a conversion ready stream;

determining a sequence of the oscillator signals that, when applied to a digital-to-analog converter, define a current flow pattern corresponding to the output frequency; and generating the current in accordance with the current flow pattern.

9. The method of claim 8, wherein generating the current comprises:

determining an algebraic sign of both the I data word and the Q data word; and determining the sequence of oscillator signals from the algebraic signs of the I data word and the Q data word; and applying the sequence of oscillator signals to the bit pattern stream.

10. The method of claim 8, wherein generating the oscillator signals comprises:

establishing the oscillator signals to have respective periods less than a period of a local oscillator signal corresponding to the output frequency.

11. The method of claim 10, wherein establishing the oscillator signals comprises:

synchronizing the oscillator signals with the local oscillator signal such that the periods of all of the oscillator signals are complete within a period of the local oscillator signal.

12. The method of claim 11, wherein synchronizing the shifted phases comprises:

synchronizing the oscillator signals one with the others so that the oscillator signals are non-overlapping.

* * * * *